(12) United States Patent
Tani et al.

(10) Patent No.: US 6,261,741 B1
(45) Date of Patent: Jul. 17, 2001

(54) PHOTOSENSITIVE HEAT-RESISTANT RESIN COMPOSITION, METHOD OF PATTERNING INSULATING FILM MADE OF THE SAME, AND PATTERNED INSULATING FILM OBTAINED THEREBY

(75) Inventors: Motoaki Tani; Nobuyuki Hayashi; Hiroyuki Machida, all of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/199,329

(22) Filed: Nov. 25, 1998

(30) Foreign Application Priority Data

May 20, 1998 (JP) .................................................. 10-138750

(51) Int. Cl.$^7$ .............................. G03F 7/027; G03F 7/28
(52) U.S. Cl. ...................................... 430/284.1; 430/285.1; 430/906; 430/325; 430/311
(58) Field of Search ..................... 430/284.1, 285.1, 430/906, 325, 311

(56) References Cited

U.S. PATENT DOCUMENTS 4,180,404 * 12/1979 Ohmura et al. ................... 430/284.1
5,053,316 * 10/1991 Suzuki et al. ..................... 430/284.1
6,013,419   1/2000 Tani et al. ............................ 430/325

FOREIGN PATENT DOCUMENTS

| 50-144431 | 11/1975 | (JP) . |
| 51-40451 | 11/1976 | (JP) . |
| 56-40329 | 9/1981 | (JP) . |
| 57-111353 | 7/1982 | (JP) . |
| 57-45785 | 9/1982 | (JP) . |
| 61-243869 | 10/1986 | (JP) . |
| 63-308037 | 12/1988 | (JP) . |

* cited by examiner

Primary Examiner—Cynthia Hamilton
(74) Attorney, Agent, or Firm—Armstrong, Westerman, Hattori, McLeland & Naughton, LLP

(57) ABSTRACT

A photosensitive heat-resistant resin composition contains a polyamideimide resin, an organic solvent for dissolving the polyamideimide, an acrylic monomer or oligomer having at least two polymerizable double bonds, and a photoreaction initiator for initiating polymerization of the acrylic monomer or oligomer by photochemical reaction. The resin composition may be used to make a heat-resistant insulating film which may be patterned by selective irradiation of ultraviolet rays. The insulating film may be interposed between different conductor layers in a build-up multilayer circuit board.

18 Claims, 1 Drawing Sheet

PHOTOSENSITIVE HEAT-RESISTANT RESIN COMPOSITION, METHOD OF PATTERNING INSULATING FILM MADE OF THE SAME, AND PATTERNED INSULATING FILM OBTAINED THEREBY

BACKGROUND OF THE INVENTION

1. Field of the Invention

The present invention relates to a photosensitive heat-resistant resin composition. The present invention also relates to a method of patterning a heat-resistant insulating film made of such a resin composition. The present invention further relates to a patterned heat-resistant insulating film.

More specifically, a photosensitive heat-resistant resin composition according to the present invention contains a polyamideimide and an acrylic resin as main components. The polyamideimide is excellent in heat-resistance, electrical insulation and toughness, whereas the acrylic resin has a nature of polymerizing or hardening under light irradiation. Thus, the resin composition of the present invention may be used as a photo-curing adhesive or for providing a minutely patterned insulating layer in a high-density printed circuit board (including a build-up multilayer circuit board) or in high-density electronic devices.

2. Description of the Related Art

Due to recent demand for size reduction, higher performance and lower cost with respect to electronic apparatuses, there has been a rapid development toward sophistication of printed circuit boards and high-density packaging of electronic devices, which has led to an active study as to a build-up multilayer wiring structure. In a build-up multilayer wiring structure, an insulating film is interposed between different wiring conductor layers, and the insulating film is minutely patterned to have via-holes for establishing electrical conduction between the different wiring conductor layers.

For the convenience of explanation, reference is now made to FIGS. 1 and 2 of the accompanying drawings for more specifically describing the build-up multilayer wiring structure. FIG. 1 is a fragmentary sectional view showing a conventional build-up multilayer wiring structure, whereas FIG. 2 is a perspective view showing a glass mask used for making such a multilayer wiring structure.

Referring first to FIG. 1, the conventional build-up multilayer wiring structure includes a first wiring conductor pattern 2 formed on each surface of a core substrate 1 which is provided with through-holes 1a (only one shown in FIG. 1). The first wiring conductor pattern 2 on one surface of the core substrate 1 is electrically connected to the first wiring conductor pattern on the opposite surface of the core substrate by way of the through-holes 1a.

Each surface of the core substrate 1 is also formed with an insulating film 3 which is suitably patterned to have via-holes 3a. Further, the surface of the insulating film 3 is formed with a second wiring conductor pattern 4 which partially extends into the respective via-holes 3a into electrical conduction with the first wiring conductor pattern 1. Depending on a particular need, an additional insulating film (or films) similarly formed with additional via-holes and an additional wiring conductor pattern may be provided to enhance the degree of circuit integration in the thickness direction without increasing the two-dimensional size (i.e., width and length).

The build-up multilayer wiring structure described above may be made by the following process.

First, a core substrate 1 is prepared which is provided with through-holes 1a and a first wiring conductor pattern 2. Each of the through-holes 1a is filled with an insulating resin 5.

Then, a photosensitive resin is uniformly applied to each surface of the core substrate 1 for forming a photosensitive resin layer 3.

Then, as shown in FIG. 2, a glass mask 6 is held in contact with the applied photosensitive resin layer 3 (which is not cured yet), and the photosensitive resin layer is irradiated with light. The glass mask 6 has impervious spots 6a, so that the portions of the photosensitive resin layer 3 corresponding to the impervious spots 6a are not exposed to light and therefore does not harden.

Then, the resin layer 3 is developed with a developer liquid and thereafter heat-treated for removal the developer liquid. As a result, via-holes 3a are formed at the portions of the resin layer 3 (insulating film) corresponding to the impervious spots 6a of the glass mask 6 by removal of the non-cured photosensitive resin.

Then, a conductor layer is formed on the patterned insulating film 3 by electroless plating or electroplating.

Then, the conductor layer is suitably etched to form a second wiring conductor pattern 4.

The degree of circuit integration may be increased by repeating the above process steps.

As a material for forming an insulating film in a build-up multilayer wiring structure or the like, a photosensitive resin composition is known which contains bisphenol epoxy acrylate, a photosensitivity enhancer, an epoxy compound and a curing agent for example (see JP-A-50-144431 and JP-A-51-40451). However, such a resin composition requires a large quantity of an organic solvent for development, so that sufficient care needs to be taken for avoiding environmental pollution and a risk of fires.

Recently, therefore, use is made of a photosensitive resin composition which can be developed with a dilute alkaline water solution in place of an organic solvent. For instance, JP-A-56-40329 and JP-A-57-45785 disclose an alkaline-developing type photosensitive resin composition containing, as a base polymer, the reaction product of an epoxy resin and an unsaturated monocarboxylic acid, to which is added a polybasic acid anhydride. Further, JP-A-61-243869 discloses an alkaline-developing type photosensitive resin composition containing novolak epoxy, this resin composition providing a good chemical resistance.

However, the epoxy-based photosensitive resin composition of the prior art described above has a glass transition temperature (Tg) of no higher than 150° C., so that it fails to provide a sufficient heat-resistance. Further, since the prior art resin composition also contains a filler such as calcium carbonate in a proportion of no less than 10 wt % relative to the epoxy resin, it may fail to provide a sufficient electrical insulation if the insulating film made of the resin composition is thin or if the intervals between the wires of the wiring conductor pattern are narrow (i.e., if the wiring conductor pattern is formed excessively fine).

SUMMARY OF THE INVENTION

It is, therefore, an object of the present invention is to provide a photosensitive heat-resistant resin composition which is excellent in photosensitivity and heat resistance for suitably forming an insulating film in a build-up printed circuit board.

Another object of the present invention is to provide a method of patterning an insulating film made of such a resin composition.

A further object of the present invention is to provide a patterned insulating film obtained by such a method.

According to a first aspect of the present invention, there is provided a photosensitive heat-resistant resin composition comprising a polyamideimide resin, an organic solvent for dissolving the polyamideimide, an acrylic monomer or oligomer having at least two polymerizable double bonds, and a photoreaction initiator for initiating polymerization of the acrylic monomer or oligomer by photochemical reaction.

The resin composition described above, when irradiated with light, hardens due to photochemical polymerization of the acrylic monomer or oligomer, and the acrylic polymer and the polyamideimide coexist in the hardened portion. Further, the resulting insulating film exhibits an excellent heat resistance due to the presence of the polyamideimide.

Preferably, the resin composition may further comprise a photosensitivity enhancer for enhancing the photochemical polymerization of the acrylic monomer or oligomer.

According to a second aspect of the present invention, there is provided a method of patterning a heat-resistant insulating film which is made of the photosensitive heat-resistant resin composition described above. Specifically, the method comprises the steps of: applying the resin composition on a substrate to form a resin layer; irradiating selected regions of the resin layer with ultraviolet rays for causing the acrylic monomer or oligomer in the selected regions to polymerize into an acrylic polymer; removing the polyamideimide and the acrylic monomer or oligomer, which remain in regions of the resin layer other than the selected regions, by dissolving with a developer liquid; and removing the organic solvent and the developer liquid by heat treatment.

According to a third aspect of the present invention, there is provided a patterned heat-resistant insulating film made by the above-described method, wherein the acrylic polymer and the polyamideimide resin coexist in the selected regions of the resin layer. The patterned heat-resistant insulating film may be advantageously interposed between different conductor layers in a build-up multilayer circuit board.

The present invention will be apparent from the detailed description of the preferred embodiments given below with reference to the accompanying drawings.

DETAILED DESCRIPTION OF THE PREFERRED EMBODIMENTS

Figure 1:
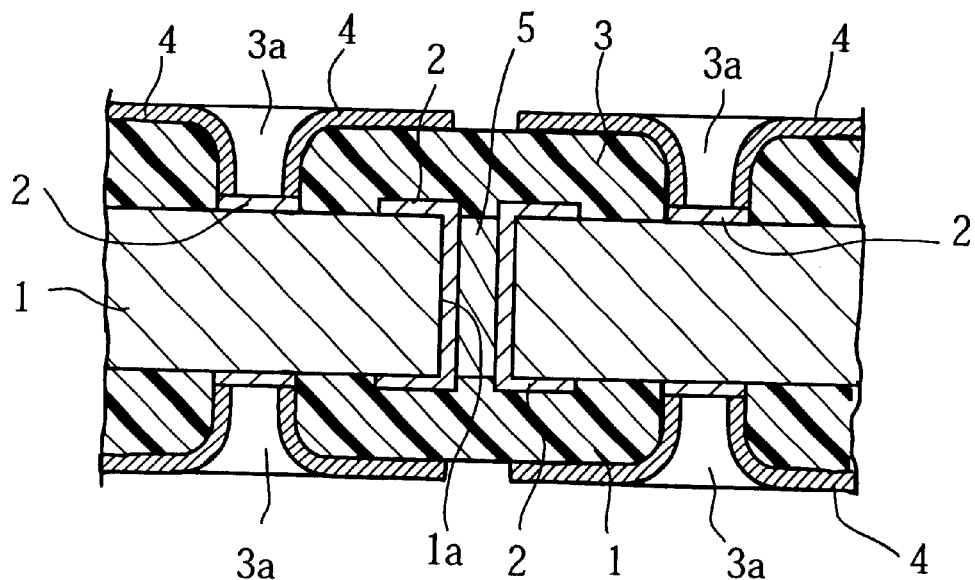
FIG. 1 is a fragmentary sectional view showing a conventional build-up multilayer wiring structure.

The preferred embodiments of the present invention will be described below with reference to the accompanying drawings.

As previously described, a photosensitive heat-resistant resin composition according to the present invention contains a polyamideimide resin, an organic solvent for dissolving the polyamideimide, an acrylic monomer or oligomer having at least two polymerizable double bonds, and a photoreaction initiator for initiating polymerization of the acrylic monomer or oligomer by photochemical reaction.

The polyamideimide resin contained in the resin composition has an excellent heat resistance and excellent mechanical properties. Such a polyamideimide resin may be prepared by reacting diamine or diisocyanate with a substantially equimolar amount of tribasic acid anhydride or tribasic acid chloride. Practical processes for synthesizing a polyamideimide typically include the amine process and the isocyanate process, as respectively indicated by the following reactions.

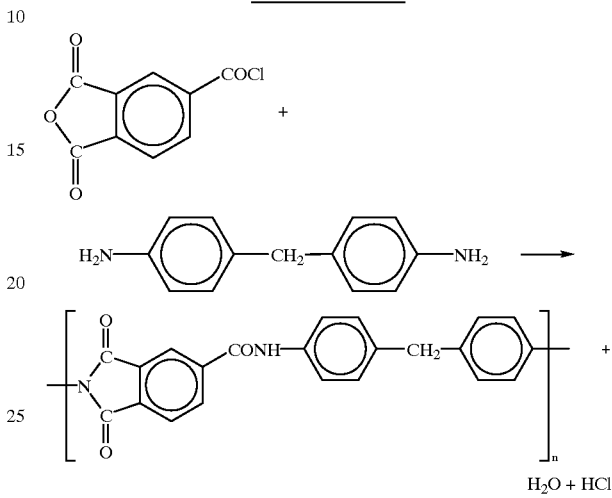

Of the above two typical processes, the isocyanate process is preferred for avoiding the inclusion of impurities such as chlorine ions in view of the fact the resin composition is utilized for forming an insulating film in a build-up multilayer printed circuit board.

A polyamideimide has imide rings each of which is a closed ring. Therefore, a solution of a polyamideimide is unlikely to change in viscosity and provides an excellent stability for storage.

Most polyamideimides are soluble only in polar basic organic solvents such as N-methyl-2-pyrolidone, N,N-dimethylacetamide and N,N-dimethylformamide. Therefore, in use, the polyamideimide is dissolved in such a solvent.

A polyamideimide having the above-mentioned structure is inherently insensitive to light. Thus, a film made of a polyamideimide resin cannot be patterned by ultraviolet irradiation for forming via-holes. According to the present invention, therefore, a polyamideimide dissolved in an organic solvent is mixed with an acrylic monomer or oligomer and a photoreaction initiator to provide a resin composition which has a photosensitivity as a whole. After light irradiation and development for formation of an insulating film, a polyamideimide and a hardened acrylic polymer (resulting from polymerization of the acrylic monomer or oligomer through photochemical reaction) coexist in the insulating film. Therefore, the inherent properties of the polyamideimide resin (including an excellent heat resistance, good mechanical properties and a good resistance against environmental changes) are succeeded by the formed insulating film which therefore may be advantageously incorporated in a build-up multilayer printed circuit board.

As previously described, the polyamideimide is dissolved in a polar basic organic solvent such as N-methyl-2-pyrolidone, N,N-dimethylacetamide or N,N-dimethylformamide. Any of these organic solvents may be used alone or in combination.

The acrylic monomer or oligomer is added for imparting photosensitivity to the resin composition, and for this purpose should preferably have at least two polymerizable double bonds. Further, it is also preferable that the acrylic monomer or oligomer, when polymerized by photochemical reaction, generates an acrylic polymer which itself has a good heat resistance for maintaining the high resistance of the insulating film as a whole. Specifically, examples of the acrylic monomer or oligomer include polyester acrylates (including derivatives thereof), epoxy acrylates (including derivatives thereof), urethane acrylates (including derivatives thereof) and silicone acrylates (including derivatives thereof). Even more specific examples include a monomer or oligomer of a polyfunctional acrylate with an isocyanuric acid structure [e.g. tris(acryloyloxyethyl)isocyanurate] or a polyfunctional acrylate with a chain structure [e.g. trimethylolpropane triacrylate, EO-modified trimethylolpropane triacrylate, pentaerythritol triacrylate, pentaerythritol tetraacrylate, dipentaerythritol hexaacrylate]. Also useful is a monomer or oligomer of bisphenol-A-diepoxy-acrylic acid or a polyfunctional acrylate having the structure represented by the following formula 1.

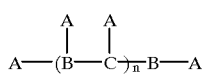

(1)

In the formula 1 above, the sign "A" represents acrylic acid ($CH_2=CHCOOH$) or a derivative thereof [e.g. methacrylic acid ($CH_2=CCH_3COOH$)], whereas the sign "B" represents a polyhydric alcohol such as 2-ethyl-2-hydroxymethyl-1,3-propanediol and pentaerythritol. Further, the sign "C" represents a polybasic acid such as 3-cyclohexene-1,2-dicarboxylic acid and 4-cyclohexene-1,2-dicarboxylic acid. Moreover, the sign "n" represents an integer ranging from 1~10.

Any of the above-mentioned acrylic monomers or oligomers may be used alone or in combination. The acrylic monomer or oligomer may be preferably contained in a proportion of 30~200 parts, particularly 50~170 parts, by weight relative to 100 parts by weight of the polyamideimide. A proportion below 30 parts by weight results in that the photosensitivity of the resin composition unduly drops. Conversely, a proportion above 200 parts by weight results in an excessive drop of compatibility with the coexistent polyamideimide while deteriorating the quality of the resultant insulating film.

The photoreaction initiator is added for causing photochemical polymerization of the acrylic monomer or oligomer. Preferred examples of photoreaction initiators include α-aminoalkylphenone or derivatives thereof, benzoin ether or derivatives thereof, ketals, acetophenone or derivatives thereof, benzophenone or derivatives thereof, thioxanthone or derivatives thereof, organic peroxides, N-phenylglycine, triazine compounds, arene iron complex, and imidazole dimer. Of these candidates, particularly useful for forming a patterned thick film are α-aminoalkylphenone or derivatives thereof, acetophenone or derivatives thereof, benzophenone or derivatives thereof, organic peroxides, and imidazole dimer. Any of these photoreaction initiators may be used alone or in combination.

Examples of α-aminoalkylphenones include 2-benzyl-2-dimethylamino-1-(4-morpholinophenyl)-butanone-1, 2-methyl-1-[4-(methylthio)phenyl]-2-morpholinopropane propanone-1 and 2-benzyl-2-dimethylamino-4'-morpholinobuthyrophenone. Examples of benzoin ethers include isopropylbenzoin ether and isobutylbenzoin ether. Examples of ketals include 1-hydroxycyclohexyl phenyl ketone and benzyl dimethyl ketal. An example of acetophenone derivatives as photoreaction initiators may be 2-hydroxy-2-methylpropiophenone. An example of benzophenone derivatives may be 3,3',4,4'-tetra-(t-butylperoxycarbonyl) benzophenone. An example of thioxanthone derivatives may be 2-methylthioxanthone. Examples of organic peroxides include ketone peroxide, peroxyketal, dialkyl peroxide and peroxyester. The triazine compounds used as a photoreaction initiator may be preferably those which have a 1,3,5-triazine structure and contain at least one trichloromethyl group such as 2,4,6-tris (trichloromethyl)-6-phenyl-1,3,5-triazine and 2,4-bis (trichloromethyl)-6-phenyl-1,3,5-triazine. Examples of arene iron complexes include ($\eta^6$-benzene)($\eta^5$-cyclopentadienyl) iron (II) hexafluorophosphate and ($\eta^6$-pyrene) ($\eta^5$-cyclopentadienyl) iron (II) hexafluoroantimonate. An example of imidazole dimers may be 2,2'-bis (o-chlorophenyl)-4,4',5,5'-tetraphenyl-1,2'-biimidazole.

The photoreaction initiator may be contained in a proportion of 3~30 parts, particularly 5~20 parts, by weight relative to 100 parts by weight of the acrylic monomer or oligomer. A proportion below 3 parts by weight results in that the photosensitivity of the resin composition unduly drops. Conversely, a proportion above 30 parts by weight results in an excessive drop of compatibility with the polyamideimide and/or the acrylic monomer or oligomer while deteriorating the quality of the resultant insulating film.

In addition to the photoreaction initiator, a photosensitivity enhancer may also be used for enhancing photochemical polymerization of the acrylic monomer or oligomer. Examples of photosensitivity enhancers include di-n-butylamine, n-butylamine, triethylamine, triethylenetetramine, 3-mercapto-4-methyl-4H-1,2,4-triazole, ketocoumarin dye, coumarin dye, thioxanthene dye, xanthene dye, and thiopyrilium salt dye. Any of these photosensitivity enhancers may be used alone or in combination.

The photosensitive heat-resistant resin composition described above may be utilized for forming a patterned insulating film in the following manner.

First, a photosensitive resin composition (containing a polyamideimide, an organic solvent, an acrylic monomer or oligomer, and a photoreaction initiator) is uniformly applied to each surface of a substrate (see the core substrate 1 shown in FIG. 1) for forming a photosensitive resin layer. The uniform application of the resin composition may be performed by known method such as spin coating, roller coating, curtain coating or screen printing.

Then, the substrate together with the coated resin layer is pre-baked for removing the organic solvent from the resin layer to a certain extent.

Figure 2:
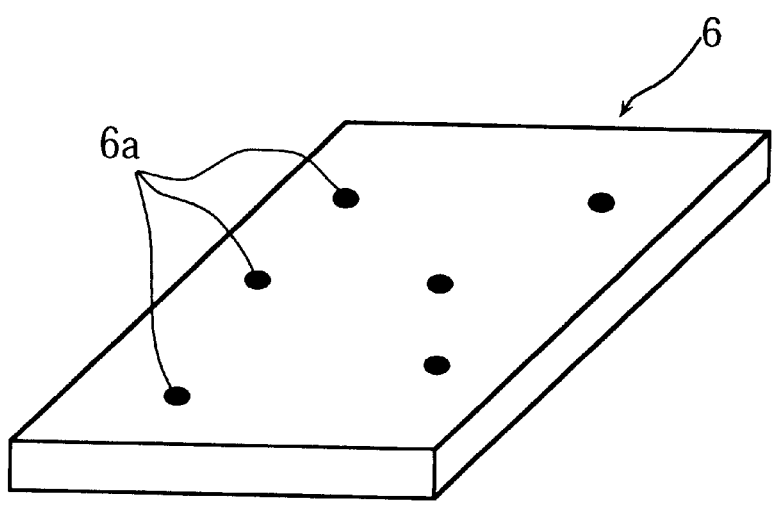
FIG. 2 is a perspective view showing a glass mask used for making such a multilayer wiring structure.

Then, a film mask or a glass mask (see the mask 6 shown in FIG. 2) is held in contact with the applied photosensitive resin layer which, in this condition, is irradiated with light. As a result, the pattern of the mask is transcribed onto the resin layer. In the case of forming via-holes in the resin layer, the mask has impervious spots in a predetermined pattern, so that the portions of the photosensitive resin layer corresponding to the impervious spots are not exposed to light. As a result, the resin layer hardens due to photochemical polymerization of the acrylic monomer or oligomer only where it is exposed to light.

Then, the partially hardened resin layer is developed with a suitable developer liquid and thereafter rinsed with a suitable rinsing liquid. As a result, the non-hardened (non-irradiated) portions of the resin layer are selectively dissolved in the developer liquid to form via-holes (see the via-holes 3a in FIG. 1).

Examples of the developer liquids usable for this purpose include N-methyl-2-pyrolidone, N,N-dimethylacetamide or N,N-dimethylformamide which is also usable as a solvent for the polyamideimide resin. An alkaline solution prepared by dissolving tetramethylammonium and sodium hydroxide in water may be used instead. Examples of the rinsing liquids include water, alcohols (e.g. methanol, ethanol, and isopropyl alcohol), and ketones (e.g. acetone and methyl ethyl ketone).

Then, a heat treatment is performed for removing the organic solvent, the developer liquid and the rinsing liquid. The heat treatment may be carried out at a temperature of e.g. 150~250° C. at which the substrate does not suffer a thermal degradation.

In this way, a suitably patterned heat-resistant insulating film (with via-holes in this embodiment) can be formed on the substrate. The portions of the insulating film remaining on the substrate contain not only an acrylic polymer (resulting from the polymerization of the acrylic monomer or oligomer) but also the polyamideimide resin present in the original resin composition. Therefore, the insulating film exhibits the properties (excellent heat resistance, mechanical strength, electrical insulation and resistance against environmental changes) which the polyamideimide resin inherently has, so that it may be advantageously interposed between conductor layers in a build-up multilayer circuit board.

Next, examples of the present invention will be specifically described.

EXAMPLE 1

In Example 1, a photosensitive heat-resistant composition was prepared by mixing the following substances in the below-indicated proportion.

| Polyimideamide Resin | |
|---|---|
| Polyimideamide varnish | 50.0 g |
| { Resin Content: 37 wt. % <br> N-methyl-2-pyrolidone: Remainder } | |
| Acrylic Oligomer | |
| Acrylic oligomer represented below | 15.0 g |
| A—(B—C)—(B—D)—B—A with A substituents | |
| { A: Acrylic acid <br> B: 2-ethyl-2-hydroxymethyl-1,3-propanediol <br> C: 3-cyclohexene-1,2-dicarboxylic acid <br> D: 4-cyclohexene-1,2-dicarboxylic acid } | |
| Photoreaction Initiator | |
| 2,2'-bis(o-chlorophenyl)-4,4',5,5'-tetraphenyl-1,2'-biimidazole | 1.50 g |
| Photosensitivity Enhancer | |
| 3-mercapto-4-methyl-4H-1,2,4-triazole | 0.70 g |

The photosensitive resin composition described above was applied on each surface of a printed board (120 mm×120 mm) by roller coating to form a resin layer. The circuit board was a glass-cloth-based, laminated BT resin board (BT: bismaleimide triazine), and each surface of the board was provided with a copper coating.

Then, the applied resin layer together with the printed board was pre-baked at a temperature of 75° C. for one hour.

Then, a negative glass mask was placed on the resin layer which, in this condition, was irradiated with ultraviolet rays (wave length: 365 nm) at an energy of 500 mJ/cm$^2$. The glass mask was formed with a pattern of via-hole forming spots with a minimum diameter of 30 μm.

Then, the resin layer was developed by spraying an aqueous solution of 15 wt. % tetramethylammonium hydride, and thereafter rinsed by spraying pure water.

Then, the developed resin layer together with the printed board was heat-treated at a temperature of 200° C. for one hour for removing the remainder of the solvent, the developer liquid and the rinsing water by evaporation.

As a result, a patterned insulating film was obtained which had a thickness of about 20 μm and was formed with a pattern of via-holes having a diameter of about 50 μm.

Then, the insulating film thus obtained was peeled off the printed board and analyzed by infrared (IR) adsorption spectrum. As a result, it was confirmed that both polyamideimide and acrylic polymer coexist in the film.

Further, the insulating film was subjected to thermogravimetric analysis (TGA) to check the thermal decomposition characteristics of the film. As a result, the insulating film suffered a 5% weight reduction at a temperature of 360° C.

Moreover, the insulating film was subjected to thermomechanical analysis (TMA) to find out the glass transition temperature (Tg) of the film. As a result, it was determined that the glass transition temperature of the insulating film was 198° C.

From the above, it has been found that the resin composition used in this example was satisfactorily photosensitive for patterning by selective ultraviolet irradiation, and that the resulting insulating film was sufficiently heat-resistant due to the presence of the polyamideimide.

EXAMPLE 2

In Example 2, a photosensitive heat-resistant composition was prepared by mixing the following substances in the below-indicated proportion.

| Polyimideamide Resin | |
|---|---|
| Polyimideamide varnish | 50.0 g |
| { Resin Content: 40 wt. % N-methyl-2-pyrolidone: Remainder } | |
| Acrylic Monomer | |
| Bisphenol A-diepoxy-acrylic acid | 20.0 g |
| Trimethylolpropane triacrylate | 8.0 g |
| Photoreaction Initiator | |
| 2-benzyl-2-dimethylamino-1-(4-morpholinophenyl)-butanone-1 | 1.50 g |
| 1-hydroxycyclohexyl phenyl ketone | 0.70 g |

The photosensitive resin composition described above was applied on each surface of a pretreated copper board by spin coating to form a resin layer.

Then, the applied resin layer together with the copper board was pre-baked at a temperature of 80° C. for 30 minutes.

Then, a negative film mask was placed on the resin layer which, in this condition, was irradiated with ultraviolet rays (wave length: 365 nm) at an energy of 800 mJ/cm². The film mask was formed with a pattern of via-hole forming spots with a minimum diameter of 50 μm.

Then, the resin layer was developed by dipping in a bath of N-methyl-2-pyrolidone under supersonic vibration, and thereafter rinsed by dipping in a bath of isopropyl alcohol.

Then, the developed resin layer together with the copper board was heat-treated at a temperature of 210° C. for 30 minutes for removing the remainder of the solvent, the developer liquid and the rinsing water by evaporation.

As a result, a patterned insulating film was obtained which had a thickness of about 40 μm and was formed with a pattern of via-holes having a diameter of about 100 μm.

Then, the insulating film thus obtained was peeled off the copper board and subjected to IR analysis. As a result, it was confirmed that both polyamideimide and acrylic polymer coexist in the film.

Further, the insulating film was subjected to TGA analysis to check the thermal decomposition characteristics of the film. As a result, the insulating film suffered a 5% weight reduction at a temperature of 365° C.

Moreover, the insulating film was subjected to TMA analysis to find out the glass transition temperature (Tg) of the film. As a result, it was determined that the glass transition temperature of the insulating film was 195° C.

From the above, it has been found that the resin composition used in this example was satisfactorily photosensitive for patterning by selective ultraviolet irradiation, and that the resulting insulating film was sufficiently heat-resistant due to the presence of the polyamideimide.

EXAMPLE 3

In Example 3, a photosensitive heat-resistant composition was prepared by mixing the following substances in the below-indicated proportion.

| Polyimideamide Resin | |
|---|---|
| Polyimideamide varnish | 50.0 g |
| { Resin Content: 30 wt. % Dimethyl acetamide: Remainder } | |
| Acrylic Monomer | |
| Dipentaerythritol hexaacrylate | 14.0 g |
| Tris (acryloyloxyethyl) isocyanurate | 6.0 g |
| Photoreaction Initiator | |
| 3,3',4,4'-tetra-(t-butylperoxycarbonyl) benzophenone | 1.0 g |

The photosensitive resin composition described above was applied on each surface of a printed board (300 mm×300 mm) by curtain coating to form a resin layer. The circuit board was a glass-cloth-based, laminated epoxy resin board, and each surface of the board was provided with a copper coating.

Then, the applied resin layer together with the printed board was pre-baked at a temperature of 90° C. for 20 minutes.

Then, a negative film mask was placed on the resin layer which, in this condition, was irradiated with ultraviolet rays (wave length: 365 nm) at an energy of 700 mJ/cm². The film mask was formed with a pattern of via-hole forming spots with a minimum diameter of 50 μm.

Then, the resin layer was developed by spraying N,N-dimethylacetamide, and thereafter rinsed by spraying isopropyl alcohol.

Then, the developed resin layer together with the printed board was heat-treated at a temperature of 170° C. for one hour for removing the remainder of the solvent, the developer liquid and the rinsing water by evaporation.

As a result, a patterned insulating film was obtained which had a thickness of about 30 μm and was formed with a pattern of via-holes having a diameter of about 100 μm.

Then, the insulating film thus obtained was peeled off the printed board and subjected to IR analysis. As a result, it was confirmed that both polyamideimide and acrylic polymer coexist in the film.

Further, the insulating film was subjected to TGA analysis to check the thermal decomposition characteristics of the film. As a result, the insulating film suffered a 5% weight reduction at a temperature of 355° C.

Moreover, the insulating film was subjected to TMA analysis to find out the glass transition temperature (Tg) of the film. As a result, it was determined that the glass transition temperature of the insulating film was 192° C.

From the above, it has been found that the resin composition used in this example was satisfactorily photosensitive for patterning by selective ultraviolet irradiation, and that the resulting insulating film was sufficiently heat-resistant due to the presence of the polyamideimide.

The present invention being thus described, it is obvious that the same maybe varied in many ways. Such variations should not be regarded as a departure from the spirit and scope of the present invention, and all such modifications as would be obvious to those skilled in the art are intended to be included within the scope of the following claims.

What is claimed is:
1. A photosensitive heat-resistant resin composition comprising:

a non photosensitive polyamideimide resin having the following structure:

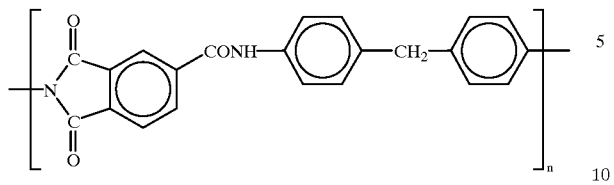

an organic solvent for dissolving the polyamideimide;
an acrylic monomer or oligomer having at least two polymerizable double bonds; and
a photoreaction initiator for initiating polymerization of the acrylic monomer or oligomer by photochemical reaction.

2. The resin composition according to claim 1, further comprising a photosensitivity enhancer for enhancing the photochemical polymerization of the acrylic monomer or oligomer.

3. The resin composition according to claim 1, wherein the acrylic monomer or oligomer is selected from the group consisting of polyester acrylates, epoxy acrylates, urethane acrylates and silicone acrylates.

4. The resin composition according to claim 1, wherein the acrylic monomer or oligomer is contained in a proportion of 30~200 parts by weight relative to 100 parts by weight of the polyamideimide.

5. The resin composition according to claim 1, wherein the photoreaction initiator is selected from the group consisting of α-aminoalkylphenone, derivatives of α-aminoalkylphenone, acetophenone, derivatives of acetophenone, benzophenone, derivatives of benzophenone, organic peroxides, and imidazole dimer.

6. The resin composition according to claim 1, wherein the photoreaction initiator is contained in a proportion of 3~30 parts by weight relative to 100 parts by weight of the acrylic monomer or oligomer.

7. The resin composition according to claim 1, wherein the organic solvent is selected from the group consisting of N-methyl-2-pyrolidone, N,N-dimethylacetamide, and N,N-dimethylformamide.

8. The resin composition according to claim 2, wherein the photosensitivity enhancer is selected from the group consisting of di-n-butylamine, n-butylamine, triethylamine, triethylenetetramine, 3-mercapto-4-methyl-4H-1,2,4-triazole, ketocoumarin dye, coumarin dye, thioxanthene dye, xanthene dye, and thiopyrilium salt dye.

9. A method of patterning a heat-resistant insulating film which is made of a photosensitive heat-resistant resin composition, the resin composition containing a polyamideimide resin having the following structure:

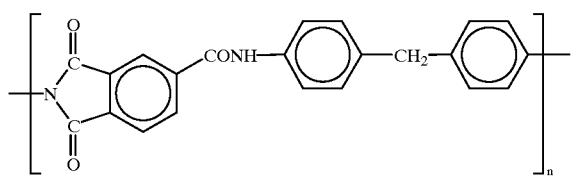

an organic solvent for dissolving the polyamideimide, an acrylic monomer or oligomer having at least two polymerizable double bonds, and a photoreaction initiator for initiating polymerization of the acrylic monomer or oligomer by photochemical reaction, wherein the method comprising the steps of:

applying the resin composition on a substrate to form a resin layer;

irradiating selected regions of the resin layer with ultraviolet rays for causing the acrylic monomer or oligomer in the selected regions to polymerize into an acrylic polymer;

removing the polyamideimide and the acrylic monomer or oligomer, which remain in regions of the resin layer other than the selected regions, by dissolving with a developer liquid; and removing the organic solvent and the developer liquid by heat treatments whereby the acrylic polymer and the non photosensitive polyamideimide resin coexist in the selected regions of the resin layer.

10. The method according to claim 9, wherein the heat treatment is performed at a temperature of 150~250° C.

11. The method according to claim 9, wherein the resin composition further comprises a photosensitivity enhancer for enhancing the photochemical polymerization of the acrylic monomer or oligomer.

12. The method according to claim 9, wherein the acrylic monomer or oligomer of the resin composition is selected from the group consisting of polyester acrylates, epoxy acrylates, urethane acrylates and silicone acrylates.

13. The method according to claim 9, wherein the acrylic monomer or oligomer of the resin composition is contained in a proportion of 30~200 parts by weight relative to 100 parts by weight of the polyamideimide.

14. The method according to claim 9, wherein the photoreaction initiator of the resin composition is selected from the group consisting of α-aminoalkylphenone, derivatives of α-aminoalkylphenone, benzophenone, derivatives of benzophenone, organic peroxides, and imidazole dimer.

15. The method according to claim 9, wherein the photoreaction initiator of the resin composition is contained in a proportion of 3~30 parts by weight relative to 100 parts by weight of the acrylic monomer or oligomer.

16. The method according to claim 9, wherein the organic solvent of the resin composition is selected from the group consisting of N-methyl-2-pyrolidone, N,N-dimethylacetamide, and N,N-dimethylformamide.

17. The method according to claim 11, wherein the photosensitivity enhancer of the resin composition is selected from the group consisting of di-n-butylamine, n-butylamine, triethylamine, triethylenetetramine, 3-mercapto-4-methyl-4H-1,2,4-triazole, ketocoumarin dye, coumarin dye, thioxanthene dye, xanthene dye, and thiopyrilium salt dye.

18. The method according to claim 9, wherein the heat resistant insulating film is interposed between different conductor layers in a build-up multilayer circuit board.

* * * * *